United States Patent
Wang et al.

(10) Patent No.: US 12,278,476 B2
(45) Date of Patent: Apr. 15, 2025

(54) UNDER VOLTAGE PROTECTION CIRCUIT AND DEVICE

(71) Applicant: BYD SEMICONDUCTOR COMPANY LIMITED, Shenzhen (CN)

(72) Inventors: Wenqing Wang, Shenzhen (CN); Jing Liu, Shenzhen (CN)

(73) Assignee: BYD SEMICONDUCTOR COMPANY LIMITED, Shenzhen (CN)

(*) Notice: Subject to any disclaimer, the term of this patent is extended or adjusted under 35 U.S.C. 154(b) by 139 days.

(21) Appl. No.: 18/145,216

(22) Filed: Dec. 22, 2022

(65) Prior Publication Data
US 2023/0117084 A1 Apr. 20, 2023

Related U.S. Application Data

(63) Continuation of application No. PCT/CN2021/102906, filed on Jun. 29, 2021.

(30) Foreign Application Priority Data

Jun. 30, 2020 (CN) .......................... 202010610382.5

(51) Int. Cl.
*H02H 3/24* (2006.01)
*H02H 1/00* (2006.01)

(52) U.S. Cl.
CPC ............ *H02H 3/24* (2013.01); *H02H 1/0007* (2013.01)

(58) Field of Classification Search
CPC .................. H02H 3/24; H02H 1/0007; H03K 2217/0081; H03K 17/22; H04L 25/4902; H02M 1/32; H02M 1/08; G01R 19/165
See application file for complete search history.

(56) References Cited

U.S. PATENT DOCUMENTS

| 5,900,683 A | 5/1999 | Rinehart et al. |
| 9,413,232 B2 * | 8/2016 | Torres .................... H02M 3/07 |

(Continued)

FOREIGN PATENT DOCUMENTS

| CN | 101091315 A | 12/2007 |
| CN | 100574102 C | 12/2009 |

(Continued)

OTHER PUBLICATIONS

The World Intellectual Property Organization (WIPO) International Search Report for PCT/CN2021/102906 Sep. 29, 2021 5 pages (with translation).

*Primary Examiner* — Jared Fureman
*Assistant Examiner* — Nicolas Bellido
(74) *Attorney, Agent, or Firm* — Wenye Tan

(57) ABSTRACT

An under voltage protection circuit includes a secondary-side output module and a primary-side input module. The secondary-side output module includes: an under voltage determination unit, configured to compare a voltage of the secondary-side output module with a preset voltage, where a first control signal is outputted when the voltage is greater than or equal to the preset voltage; and a second control signal is outputted when the voltage is less than a preset voltage; and a pulse signal generation unit, configured to transmit a periodic first pulse signal according to the first control signal and a second pulse signal according to the second control signal, where a pulse width of the second pulse signal is greater than that of the first pulse signal. The primary-side input module is configured to determine a state of the secondary-side output module according to the first pulse signal and the second pulse signal.

10 Claims, 2 Drawing Sheets

(56) References Cited

U.S. PATENT DOCUMENTS

| | | | |
|---|---|---|---|
| 9,948,175 B2* | 4/2018 | Zhao | H02M 3/33592 |
| 10,540,234 B2* | 1/2020 | Dewa | H03K 3/017 |
| 10,554,456 B2 | 2/2020 | Rehman et al. | |
| 10,862,294 B2* | 12/2020 | Turcan | H03K 5/24 |
| 2011/0228570 A1 | 9/2011 | Li et al. | |
| 2012/0099345 A1* | 4/2012 | Zhao | H02M 3/33592 |
| | | | 363/21.05 |
| 2015/0381035 A1 | 12/2015 | Torres et al. | |
| 2016/0149480 A1 | 5/2016 | Tzeng et al. | |

FOREIGN PATENT DOCUMENTS

| | | | | |
|---|---|---|---|---|
| CN | 103546020 | A | 1/2014 | |
| CN | 203457063 | U | 2/2014 | |
| CN | 104052248 | A | 9/2014 | |
| CN | 105958435 | A | 9/2016 | |
| CN | 206601436 | U | 10/2017 | |
| CN | 105264757 | B | 12/2017 | |
| CN | 110837044 | A | 2/2020 | |
| CN | 110854819 | A | 2/2020 | |
| CN | 109428622 | B | 8/2021 | |
| CN | 110120773 | B | 8/2023 | |
| EP | 2996232 | A1 * | 3/2016 | H02H 3/16 |
| EP | 2996232 | B1 | 1/2019 | |
| GB | 2294371 | A | 4/1996 | |

\* cited by examiner

UNDER VOLTAGE PROTECTION CIRCUIT AND DEVICE

CROSS-REFERENCE TO RELATED APPLICATIONS

The present application is a continuation application of PCT application No. PCT/CN2021/102906 filed on Jun. 29, 2021, which claims priority to Chinese Patent Application No. 202010610382.5, filed on Jun. 30, 2020 and entitled "UNDER VOLTAGE PROTECTION CIRCUIT AND DEVICE". The entire content of all of the above-referenced applications is incorporated herein by reference.

FIELD

The present disclosure relates to the field of under voltage protection of pulse width modulation, and more specifically, to an under voltage protection circuit and device.

BACKGROUND

In an ultra-high voltage power tube driving circuit, an input terminal is usually at 0 V and an output terminal is at hundreds of V or even more than 1000 V due to different power domains of the input terminal and the output terminal. Therefore, the input terminal and the output terminal need to be isolated from each other. Since the input stage and the output stage are isolated from each other, the input stage cannot directly detect a power supply voltage of the output stage.

In an existing solution, a frequency generator is required be used at the input terminal and the output terminal, that is to say, a clock signal is required to be provided for transmission and receipt of an under voltage recovery signal, which leads to an additional circuit. In addition, a frequency of transmission of the input signal is required to be consistent with a frequency of determination as to the output signal. In order to improve the response speed of the input terminal, a very high clock frequency is usually used, which greatly increases the chip loss.

SUMMARY

The present disclosure is intended to resolve at least one of the technical problems existing in the related art.

The present disclosure provides an under voltage protection circuit and device.

According to one aspect of the present disclosure, an under voltage protection circuit is provided. The under voltage protection circuit includes a primary-side input module and a secondary-side output module. The primary-side input module is connected with the secondary-side output module, and secondary-side output module includes: an under voltage determination unit, configured to compare a voltage of the secondary-side output module with a preset voltage, where a first control signal is outputted when the power supply voltage of the secondary-side output module is greater than or equal to the preset voltage; and a second control signal is outputted when the voltage of the secondary-side output module is less than a preset voltage; and a pulse signal generation unit, configured to transmit a periodic first pulse signal according to the first control signal and transmit a second pulse signal according to the second control signal, where a pulse width of the second pulse signal is greater than a pulse width of the first pulse signal. The primary-side input module is configured to determine, according to the first pulse signal, that the secondary-side output module is in a non-under voltage state and determine, according to the second pulse signal, that the secondary-side output module is in an under voltage protection state.

According to another aspect of the present disclosure, an under voltage protection method for an under voltage protection circuit is provided. The under voltage protection circuit includes a primary-side input module, and a secondary-side output module, where the primary-side input module is connected with the secondary-side output module, and the secondary-side output module comprises an under voltage determination unit and a pulse signal generation unit. The method includes: acquiring a voltage of the secondary-side output module and a preset voltage; comparing, by the under voltage determination unit, the acquired voltage of the secondary-side output module with the preset voltage, so as to output a first control signal or a second control signal; transmitting, by the pulse signal generation unit, a periodic first pulse signal according to the received first control signal and transmitting a second pulse signal according to the second control signal; and determining, by the primary-side input module, a state of the secondary-side output module according to the first pulse signal and the second pulse signal.

The present disclosure further provides an under voltage protection device, which includes an isolator and the above under voltage protection circuit.

The solutions in the present disclosure neither require an additional clock circuit nor increase the losses of the primary and secondary-side chip modules, but ensure quicker real-time responses made by the primary-side input module to the under voltage protection and recovery of the secondary-side output module while preventing malfunction of the primary-side input module, and improve the accuracy of under voltage state collection of the secondary-side input module by the primary-side input module.

BRIEF DESCRIPTION OF THE DRAWINGS

Through a more detailed description of embodiments of the present disclosure in combination with the accompanying drawings, the above and other objectives, features and advantages of the present disclosure are more obvious. The same reference symbol generally represents the same component.

DETAILED DESCRIPTION

The following describes in detail embodiments of the present disclosure with reference to the accompanying drawings. Although the accompanying drawings show certain implementations of the present disclosure, it should be understood that the present disclosure may be implemented in various manners and is not limited by the implementations described herein. To the contrary, the implementations are provided to make the present disclosure more thorough and complete, and the scope of the present disclosure can be fully conveyed to a person skilled in the art.

To make the technical problems solved, the technical solutions, and the advantages of the present disclosure more comprehensible, the following further describes the present disclosure in detail with reference to the accompanying drawings and the embodiments. It should be understood that specific embodiments described herein are only used to describe the present disclosure instead of limiting the present disclosure.

The solutions in the present disclosure neither require an additional clock circuit nor increase the losses of primary and secondary-side chip modules, but ensure quicker real-time responses made by a primary-side input module to the under voltage protection and recovery of a secondary-side output module while preventing malfunction of the primary-side input module, and retain transmission of a first pulse signal in a non-under voltage state.

Figure 1:
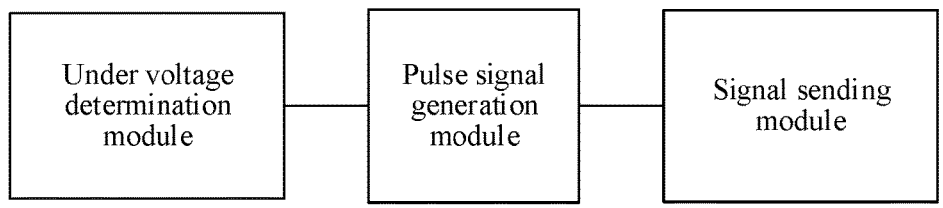
FIG. 1 is a diagram of a secondary-side output module in an embodiment of an under voltage protection circuit according to the present disclosure.

As shown in FIG. 1, the under voltage determination unit is configured to compare a voltage of the secondary-side output module with a preset voltage. The under voltage determination unit outputs a first control signal when the voltage of the secondary-side output module is greater than or equal to the preset voltage. The under voltage determination unit outputs a second control signal when the voltage of the secondary-side output module is less than the preset voltage. The pulse signal generation unit is configured to generate a corresponding pulse signal according to the received control signal. The pulse signal generation unit generates a periodic first pulse signal when receiving the first control signal, and generates a second pulse signal when receiving the second control signal. The second pulse signal is an aperiodic signal. The second pulse signal is generated at the moment of under voltage of the secondary-side output module. A pulse width of the second pulse signal is greater than a pulse width of the first pulse signal. The signal transmission unit is configured to transmit the first pulse signal and the second pulse signal to a primary-side input module. The primary-side input module determines that the secondary-side output module is in a non-under voltage state when receiving the first pulse signal, that is to say, under voltage has not occurred on the secondary-side output module. The primary-side input module determines that the secondary-side output module is in an under voltage protection state when receiving the second pulse signal, that is to say, under voltage has occurred on the secondary-side output module. In this way, the generated pulse signal can be accurately sampled by the primary-side when the secondary-side of an ultra-high voltage power tube driving circuit encounters under voltage.

Figure 4:
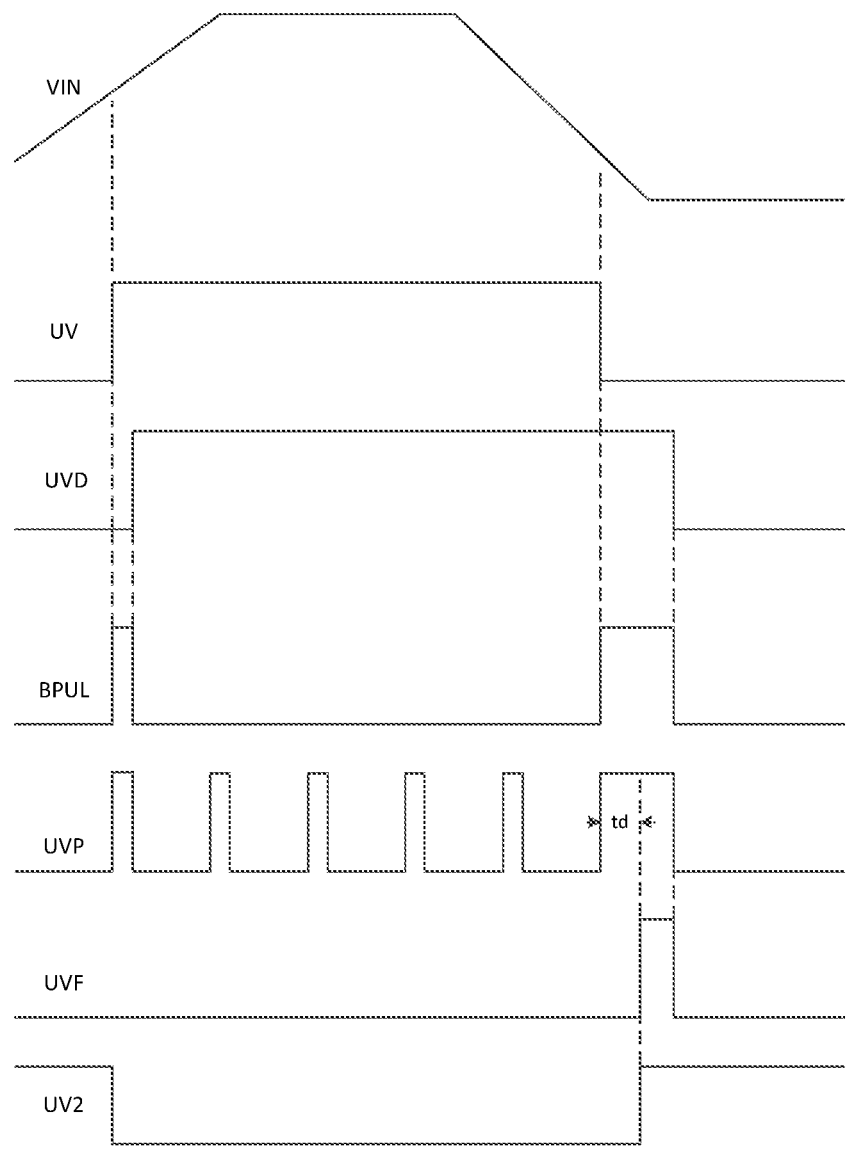
FIG. 4 is a waveform diagram of the embodiment of the under voltage protection circuit according to the present disclosure.

As shown in FIG. 4, the under voltage determination unit is mainly configured to determine a power supply voltage of the secondary-side output module. When the voltage of the secondary-side output module is greater than a set under voltage recovery threshold, the under voltage determination unit outputs an UV signal which is a level of "1". When the power supply voltage is less than a set under voltage protection threshold, that is, in the under voltage state, the under voltage determination unit outputs an UV signal which is a level of "0".

In an embodiment, the second pulse signal is a wide pulse.

Specifically, the pulse signal generation unit generates the second pulse signal when receiving the second control signal. The second pulse signal is different from the periodic first pulse signal, and is an aperiodic signal. That is to say, the first pulse signal is a signal that is continuously transmitted. Assuming that the first pulse signal has a pulse width time t1 of 2 µs, while the second pulse signal turns into a relatively wide pulse signal only at the moment of an under voltage condition at the secondary-side output module, and assuming that the second pulse signal has a pulse width time t2 of 10 µs, while the pulse width of the second pulse signal is required to be greater than the pulse width of the first pulse signal, that is, t2>t1, not only the pulse is continuously transmitted in the non-under voltage state, but also the relatively wide pulse signal is transmitted to the primary-side input module at the moment of under voltage of the secondary-side output module, so that the primary-side input module can detect and determine whether under voltage occurs on the secondary-side output module according to the width of the pulse.

In an embodiment, the primary-side input module is further configured to determine that the secondary-side output module is in the under voltage protection state when receiving no first pulse signal within a preset time.

Specifically, the primary-side input module determines the state of the secondary-side output module according to the first pulse signal and the second pulse signal. Since the first pulse signal is a pulse signal that is continuously transmitted, the primary-side input module continuously receives the first pulse signal transmitted by the secondary-side output module. When the under voltage occurs, the primary-side input module cannot receive the first pulse signal outputted by the secondary-side output module, and therefore determines that the secondary-side output module is in the under voltage protection state. A dual signal determination as to under voltage protection of the primary-side chip and the secondary-side chip may be made by: firstly making a determination as to a pulse width of an under voltage control transformer pin, where when the width of the second pulse signal is greater than a set under voltage pulse width threshold, the secondary-side output module is considered to be in the under voltage protection state, and secondly continuously sampling the pulse of the under voltage control transformer pin, where when the primary-side input module fails to sample the first pulse signal within a set time period, the secondary-side output module is considered to be in the under voltage protection state.

Figure 2:
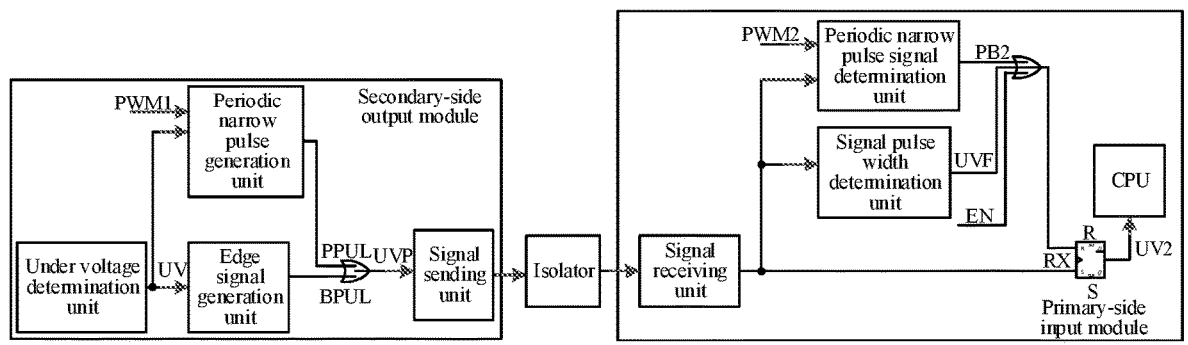
FIG. 2 is a principle structure diagram in the embodiment of the under voltage protection circuit according to the present disclosure.

As shown in FIG. 2, in an embodiment, the pulse signal generation unit includes a periodic narrow pulse generation unit and an edge signal generation unit. The periodic narrow pulse generation unit is configured to transmit a periodic pulse signal in the non-under voltage state, and the edge signal generation unit is configured to transmit a pulse signal in the under voltage protection state.

A first input terminal of the periodic narrow pulse generation unit is configured to input a first PWM signal. A second input terminal of the periodic narrow pulse generation unit is connected with an output terminal of the under voltage determination unit. An output terminal of the periodic narrow pulse generation unit is connected with an output terminal of the edge signal generation unit. An input terminal of the edge signal generation unit is connected with the output terminal of the under voltage determination unit.

The pulse signal generation unit further includes a first calculation unit. The first input terminal of the periodic narrow pulse generation unit is configured to input the first PWM signal. The second input terminal of the module is connected with the output terminal of the under voltage determination unit. The output terminal of the periodic narrow pulse generation unit is connected with a first input terminal of the first calculation unit. The input terminal of the edge signal generation unit is connected with the output terminal of the under voltage determination unit. The output terminal of the edge signal generation unit is connected with a second input terminal of the first calculation unit. An output terminal of the first calculation unit is connected with the signal transmission unit. That is to say, the output terminal of the periodic narrow pulse generation unit is connected with the output terminal of the edge signal generation unit, and then connected with the first calculation unit.

Figure 3:
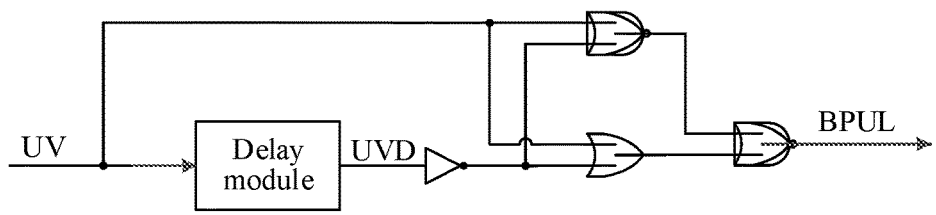
FIG. 3 is a circuit diagram of a specific implementation of an edge signal generation module in the embodiment of the under voltage protection circuit according to the present disclosure.

Specifically, as shown in FIG. 3, the pulse signal generation unit of the secondary-side output module is mainly composed of the periodic narrow pulse generation unit, the edge signal generation unit, and the first calculation unit. The edge signal generation unit is controlled by the under voltage determination unit. The edge signal generation unit includes a delay subunit. The UV signal outputted by the under voltage determination unit is provided to the delay subunit in the edge signal generation unit, and the delay subunit generates a UVD signal. The UVD signal and the input UV signal are in phase, and have a set delay, and a delay time thereof varies with a state of the UV signal.

For example, when the UV signal is flipped from "0" to "1", the power supply of the secondary-side output module is in the non-under voltage state, and the corresponding delay time is t1, which is relatively short (such as 2 µs). When the UV signal is flipped from "1" to "0", the power supply of the secondary-side output module is in the non-under voltage protection state, and the corresponding delay time is t2, which is relatively long (such as 10 µs). Some logical processes are performed on the UV signal and the UVD signal to obtain a BPUL signal, which corresponds to a pulse width generated by the delay subunit when the UV signal rises or falls. Due to a correspondence between the delay time and the UV signal state, a pulse width of the BPUL signal corresponding to the non-under voltage state is relatively narrow, such as t1, and a BPUL signal pulse width corresponding to the under voltage protection state is relatively wide, such as t2. Corresponding pulse waveforms are shown in FIG. 4.

The periodic narrow pulse generation unit is controlled jointly by an input PWM1 signal of the system and the under voltage determination signal UV. In the under voltage protection state, that is, when UV="0", the periodic narrow pulse generation unit does not transmit a valid signal, and the module outputs a signal PPUL="0". In the non-under voltage state, UV="1", the periodic narrow pulse generation module is controlled by the PWM1, and a signal edge of the PWM1 triggers generation of a pulse signal. Since the PWM1 signal is an input periodic signal, the pulse signal PPUL generated after the trigger is a periodic signal synchronized with the PWM1. Narrow pulse signals generated by the periodic narrow pulse generation unit have consistent narrow widths. That is to say, the pulse width is set to approximately t1.

An operation process of the secondary-side output module is analyzed through the above modules as follows.

1. When an initial power supply of the secondary-side output module is less than the under voltage protection threshold of the under voltage determination unit, the UV output signal is kept as the level of "0". At this time, the BPUL outputs no signal, the PPUL outputs no signal, the UVP output is kept as the level of "0", and the signal transmission unit of the secondary-side output module does not operate.

2. When the power supply voltage of the secondary-side output module gradually rises to be greater than the under voltage recovery threshold, the edge signal generation unit is triggered at the moment of under voltage of flipping of the UV output signal from the level of "0" to the level of "1", the BPUL outputs a pulse having a relatively narrow pulse width t1, and the UVP transmits a signal having the same pulse and provides the signal to the signal transmission unit, and the signal transmission unit transmits the signal to the primary-side chip through an isolator for processing;

3. The UV output signal is kept as the level of "1" before the power supply of the secondary-side output module drops to be less than the secondary-side under voltage protection threshold. At this time, the periodic narrow pulse generation module uses the PWM1 as a trigger signal to transmit the periodic narrow pulse. The first pulse signal is a signal having a pulse width time of about t1. The signal is then provided to the signal transmission unit through the UVP, and is transmitted to the primary-side chip through the isolator for processing.

4. When the secondary-side chip power supply gradually drops from a high voltage to be lower than the secondary-side under voltage protection threshold, the edge signal generation unit is triggered at the moment of under voltage of flipping of the UV output signal from the level of '1' to the level of '0'. The BPUL provides a pulse having a relatively wide width that is equal to the pulse width time t2 of the second pulse signal, and the UVP signal transmits a signal with the same pulse, and provides the signal to the signal transmission unit, and the signal transmission unit transmits the signal to the primary-side chip through the isolator for processing.

A pulse period is controlled by the PWM signal of the secondary-side output module chip, so that a sampling frequency of the primary and secondary-sides can be effectively matched without requiring an additional circuit, and a dual signal determination as to the under voltage protection of the primary and secondary-side chips is made.

In an embodiment, the primary-side input module includes a determination module configured to determine a state of the secondary-side output module according to the first pulse signal and the second pulse signal.

Specifically, the primary-side input module is composed of the determination module, a periodic narrow pulse signal determination unit, an RS trigger, and a CPU, and the like. A signal receiving unit is configured to receive the first pulse signal and the second pulse signal from the signal transmission module of the secondary-side output module. The determination module configured to determine the state of the secondary-side output module according to the first pulse signal and the second pulse signal. The RS trigger is configured to output a UV signal to the CPU according to the first pulse signal and the second pulse signal. The CPU is configured to perform an operation for the non-under voltage state according to the received UV signal outputted according to the first pulse signal, and perform an operation for the under voltage protection state according to the received UV signal outputted according to the second pulse signal.

In an embodiment, the secondary-side output module further includes a signal transmission unit configured to transmit the first pulse signal and the second pulse signal to the primary-side input module. The primary-side input module further includes a signal receiving unit configured to receive the first pulse signal and the second pulse signal from the signal transmission unit. The output terminals of the periodic narrow pulse generation unit and the edge signal generation unit are respectively connected with an input terminal of the signal transmission unit. An output terminal of the signal transmission unit is connected with an input terminal of the signal receiving unit. An output terminal of the signal receiving unit is connected with the determination module.

In an embodiment, the determination module includes a periodic narrow pulse signal determination unit and a signal pulse width determination unit. The periodic narrow pulse signal determination unit is configured to receive a pulse generated by the periodic narrow pulse generation unit. The signal pulse width determination unit is configured to receive and determine a pulse generated by the edge signal generation unit. A first input terminal of the periodic narrow pulse signal determination unit is connected with a second PWM signal input terminal. A second input terminal of the periodic narrow pulse signal determination unit is connected with an output terminal of the signal receiving unit. An output terminal of the periodic narrow pulse signal determination unit is connected with an output terminal of the signal pulse width determination unit and an enable (EN) signal. An input terminal of the signal pulse width determination unit is connected with the output terminal of the signal receiving unit.

The determination module further includes a second calculation unit. The output terminal of the periodic narrow pulse signal determination unit is connected with the output terminal of the signal pulse width determination unit and the EN signal, and then connected with the second calculation unit. Specifically, a first input terminal of the periodic narrow pulse signal determination unit is connected with the second PWM signal input terminal. A second input terminal of the periodic narrow pulse signal determination unit is connected with the output terminal of the signal receiving unit. The output terminal of the periodic narrow pulse signal determination unit is connected with a first input terminal of the second calculation unit. The input terminal of the signal pulse width determination unit is connected with the output terminal of the signal receiving unit. An output terminal of the signal pulse width determination module is connected with the second input terminal of the second calculation unit. A third input terminal of the second calculation unit is inputted with the EN signal.

As shown in FIG. 2, the signal pulse width determination unit is mainly configured to determine the width of the pulse signal received by the signal receiving unit from the secondary-side output module chip. It is assumed herein that the pulse width determination threshold is t3. An output signal of the module, UVF output, is "0" when determining that the pulse width of the signal RX received by the signal receiving unit is less than t3, and the UVF output is "1" when the pulse width of the RX is greater than or equal to t3.

The time t3 herein is set with reference to the time settings of the pulse width time t1 of the first pulse signal and the pulse width time t2 of the second pulse signal of the secondary-side output module chip. Assuming that the pulse width t1 transmitted by the secondary chip is 2 μs and t2 is 10 μs, t3 should be set to be greater than 2 μs and less than 10 μs, for example, set as 5 μs, 6 μs, 8 μs, or the like.

The periodic narrow pulse signal determination unit is controlled by the RX signal outputted by the signal receiving unit and a system operation signal PWM2. The PWM2 signal is configured to generate an output related to a periodicity thereof. A frequency of the PWM2 signal may be simply divided. Assuming divide-by-four is adopted for the PWM2 signal and provided that RX is kept at "0", when four periods are inputted through the PWM2, a PB2 output will turn into "1". The RX signal is configured to reset the periodic narrow pulse signal generator. Once RX="1" is set, an internal circuit frequency divider is reset, that is, recounting is required to keep the outputted PB2 signal as "0".

In an embodiment, the output terminal of the second calculation unit is connected with an input terminal R of the trigger, an input terminal S of the trigger is connected with the output terminal of the signal receiving unit, an output terminal of the trigger is connected with the CPU, and a transmission frequency of the signal transmission unit is greater than a receiving frequency of the signal receiving unit.

An operation process of the primary-side input module in combination with the secondary-side output module is described as follows:

1. In a case that the initial power supply voltage of the secondary-side output chip is very low, a secondary-side under voltage protection module transmits no signal. Since the output terminal of the second calculation unit is connected with the input terminal R of the trigger, the input terminal S of the trigger is connected with the output terminal of the signal receiving unit, and the output terminal of the trigger is connected with the CPU, when the signal receiving unit included in the primary-side input module outputs a level of "0", the input terminal S of the RS trigger outputs the level of "0". At this time, the EN signal of the primary-side input module is a level of "1" (the EN signal is usually controlled by the power supply, and it is assumed herein that the EN signal during power-on is a level of "1", and is flipped to the level of "0" once the power supply is established, and therefore, the EN signal is merely used for power-on initialization, and during subsequent analysis, it is assumed that the EN signal is the level of "0"). A level of "0" of an output signal of the RS trigger, i.e., an output signal UV2 generated from a determination as to under voltage of a secondary-side power supply, indicates that the secondary-side output module is in the under voltage state.

2. Once a core power supply voltage of the secondary-side output module rises to be greater than a secondary under voltage recovery threshold, the secondary-side output module continuously outputs a square wave signal having a pulse width of t1. A pulse signal of the synchronization signal PWM1 of the periodic narrow pulse generation module is provided to the primary-side input module through the signal receiving unit, and the signal having the output pulse waveform of RX is provided to the terminal S of the RS trigger, so that the output UV2 of the RS trigger is flipped to the level of "1".

In addition, since the pulse width of the RX signal is a relatively narrow, the output signal UVF of the signal pulse width determination unit is kept as the level of "0". Moreover, since the pulse period transmitted from the secondary-side transmission module is in synchronization with the signal PWM1, the signal PWM1 and the signal PWM2 are both used as the system operation signal, and the frequencies of the two signals are approximately equal, the signal frequency of the RX is much greater than the signal frequency of the PWM2 signal after the frequency division, and the output PB2 signal of the periodic narrow pulse signal generator is kept as the level of "0" output. That is to say, the input terminal R of the RS trigger is kept as the level of "0" input. Therefore, the output UV2 is kept as the level of "1" which means that the power supply voltage of the secondary-side output module is in a normal power supply state.

3. Once the power supply voltage of the secondary-side output module drops to be less than the under voltage protection threshold of the secondary-side output module, the secondary-side output module immediately transmits an instant pulse signal with the pulse width time t2 of the second pulse signal. At this time, the primary-side input module receives the RX signal, and learns, through the signal pulse width determination unit, that the output signal UVF is flipped to the level of "1", that is, the terminal R of the RS trigger is the level of "1". Therefore, the output of the output UV2 signal is flipped to the level of "0", which means that the secondary-side output module is being in the under voltage protection state. The RX signal is also provided to the terminal S of the RS trigger. However, since the UVF signal is an output signal after processing of the RX signal, which has a delay compared with the RX signal, that is to say, the RX signal is flipped to the level of "0" signal earlier than the UVF signal, the UV2 signal is not affected or interfered with by flipping of the RX signal during the output.

Moreover, once voltage protection occurs on the secondary-side input module, the secondary-side input module merely receives the pulse signal having the pulse width of t2 transmitted by the secondary-side input module at the moment of under voltage of the under voltage, and no longer transmits pulses to the primary-side input module. Therefore, after the periodic narrow pulse signal determination unit of the primary-side input module outputs the PWM2 signal for several periods, the output signal is also flipped to the level of "1", which further ensures correct output of the UV2 signal.

An under voltage protection method includes: acquiring a voltage of the secondary-side output module and a preset voltage; comparing, by the under voltage determination unit, the acquired voltage of the secondary-side output module with the preset voltage, so as to output a first control signal or/and a second control signal; transmitting, by the pulse signal generation unit, a periodic first pulse signal according to the received first control signal and transmitting a second pulse signal according to the second control signal; and determining, by the determination module, a state of the secondary-side output module according to the first pulse signal and the second pulse signal.

Specifically, the determining, by the determination module, a state of the secondary-side output module according to the first pulse signal and the second pulse signal includes: determining, according to the acquired first pulse signal, that the secondary-side output module is in a non-under voltage state; and determining, according to the acquired second pulse signal, that the secondary-side output module is in an under voltage protection state.

An under voltage protection device includes an isolator and any of the above under voltage protection circuits. An outputted abnormal fault signal is provided to the isolator via a secondary-side output module, a primary-side input module transmits the received outputted feedback abnormal fault signal. The primary-side input module is connected with one end of the isolator, and an other end of the isolator is connected with the secondary-side output module to form the under voltage protection device.

The foregoing descriptions are merely preferred embodiments of the present disclosure, but are not intended to limit the present disclosure. Any modification, equivalent replacement, or improvement made within the spirit and principle of the present disclosure shall fall within the protection scope of the present disclosure.

Although the disclosed embodiments of the present disclosure are already shown and described, a person of ordinary skill in the art may understand that various changes, modifications, replacements and variations may be made to the embodiments without departing from the principles and spirit of the present disclosure, and the scope of the present disclosure is as defined by the appended claims and their equivalents.

What is claimed is:

1. An under voltage protection circuit, comprising:
   a primary-side input module, and a secondary-side output module,
   wherein the primary-side input module is connected with the secondary-side output module, and the secondary-side output module comprises:
   an under voltage determination unit, configured to compare a voltage of the secondary-side output module with a preset voltage, wherein a first control signal is outputted when the voltage of the secondary-side output module is greater than or equal to the preset voltage; and a second control signal is outputted when the voltage of the secondary-side output module is less than a preset voltage;
   a pulse signal generation unit, configured to transmit a periodic first pulse signal according to the first control signal and transmit a second pulse signal according to the second control signal, wherein a pulse width of the second pulse signal is greater than a pulse width of the first pulse signal,
   wherein:
   the under voltage determination unit is connected with the pulse signal generation unit; and
   the primary-side input module is configured to determine, according to the first pulse signal, that the secondary-side output module is in a non-under voltage state and determine, according to the second pulse signal, that the secondary-side output module is in an under voltage protection state.

2. The under voltage protection circuit according to claim 1, wherein the primary-side input module is further configured to determine that the secondary-side output module is in the under voltage protection state when receiving no first pulse signal within a preset time.

3. The under voltage protection circuit according to claim 1, wherein
   the pulse signal generation unit comprises a periodic narrow pulse generation unit and an edge signal generation unit;
   the periodic narrow pulse generation unit is configured to transmit a periodic pulse signal in the non-under voltage state;
   the edge signal generation unit is configured to transmit a pulse signal in the under voltage protection state;
   a first input terminal of the periodic narrow pulse generation unit is configured to input a first pulse-width modulation (PWM) signal; a second input terminal of the periodic narrow pulse generation unit is connected with an output terminal of the under voltage determination unit; an output terminal of the periodic narrow pulse generation unit is connected with an output terminal of the edge signal generation unit; and an input terminal of the edge signal generation unit is connected with the output terminal of the under voltage determination unit.

4. The under voltage protection circuit according to claim 1, wherein
   the primary-side input module comprises:
   a determination module, configured to determine a state of the secondary-side output module according to the first pulse signal and the second pulse signal.

5. The under voltage protection circuit according to claim 1, wherein the secondary-side output module further comprises a signal transmission unit configured to transmit the first pulse signal and the second pulse signal to the primary-side input module; the primary-side input module further comprises a signal receiving unit configured to receive the first pulse signal and the second pulse signal from the signal transmission unit; the output terminals of the periodic narrow pulse generation unit and the edge signal generation unit are respectively connected with an input terminal of the signal transmission unit; an output terminal of the signal transmission unit is connected with an input terminal of the signal receiving unit; and an output terminal of the signal receiving unit is connected with the determination module.

6. The under voltage protection circuit according to claim 1, wherein the determination module comprises a periodic narrow pulse signal determination unit and a signal pulse width determination unit;
the periodic narrow pulse signal determination unit is configured to receive a pulse generated by the periodic narrow pulse generation unit;
the signal pulse width determination unit is configured to receive and determine a pulse generated by the edge signal generation unit; and
a first input terminal of the periodic narrow pulse signal determination unit is connected with a second PWM signal input terminal; a second input terminal of the periodic narrow pulse signal determination unit is connected with an output terminal of the signal receiving unit; an output terminal of the periodic narrow pulse signal determination unit is connected with an output terminal of the signal pulse width determination unit and an enable (EN) signal; and an input terminal of the signal pulse width determination unit is connected with the output terminal of the signal receiving unit.

7. The under voltage protection circuit according to claim 1, wherein a transmission frequency of the signal transmission unit is greater than a receiving frequency of the signal receiving unit.

8. An under voltage protection device, comprising an isolator and the under voltage protection circuit according to claim 1.

9. An under voltage protection method for an under voltage protection circuit having a primary-side input module, and a secondary-side output module, wherein the primary-side input module is connected with the secondary-side output module, and the secondary-side output module comprises an under voltage determination unit and a pulse signal generation unit, the method comprising:
acquiring a voltage of the secondary-side output module and a preset voltage;
comparing, by the under voltage determination unit, the acquired voltage of the secondary-side output module with the preset voltage, so as to output a first control signal or a second control signal;
transmitting, by the pulse signal generation unit, a periodic first pulse signal according to the received first control signal and transmitting a second pulse signal according to the second control signal; and
determining, by the primary-side input module, a state of the secondary-side output module according to the first pulse signal and the second pulse signal.

10. The under voltage protection circuit according to claim 9, wherein the determining, by the primary-side input module, a state of the secondary-side output module according to the first pulse signal and the second pulse signal comprises:
determining, according to the acquired first pulse signal, that the secondary-side output module is in a non-under voltage state; and
determining, according to the acquired second pulse signal, that the secondary-side output module is in an under voltage protection state.

* * * * *